United States Patent [19]

Tamegaya

[11] Patent Number: 4,970,416
[45] Date of Patent: Nov. 13, 1990

[54] EMITTER COUPLED LOGIC CIRCUIT HAVING RAPID OUTPUT VOLTAGE

[75] Inventor: Yukio Tamegaya, Tokyo, Japan

[73] Assignee: NEC Corporation, Tokyo, Japan

[21] Appl. No.: 416,134

[22] Filed: Oct. 2, 1989

[30] Foreign Application Priority Data

Sep. 30, 1988 [JP] Japan .................................. 63-246378

[51] Int. Cl.$^5$ ............................................ H03K 17/04
[52] U.S. Cl. .................................. 307/455; 307/270; 307/475; 307/496
[58] Field of Search ............... 307/443, 455, 475, 494, 307/496, 270

[56] References Cited

U.S. PATENT DOCUMENTS

| | | | |
|---|---|---|---|
| 4,533,838 | 8/1985 | Fujita ............................... | 307/455 X |
| 4,539,493 | 9/1985 | Vanadarajan ..................... | 307/455 |
| 4,626,709 | 12/1986 | Mazumder et al. ............... | 307/455 |
| 4,633,104 | 12/1986 | Mallinson ......................... | 307/455 X |
| 4,645,951 | 2/1987 | Uragami ........................... | 307/443 X |
| 4,888,501 | 12/1989 | Sanwo et al. ..................... | 307/475 |
| 4,902,915 | 2/1990 | Tran ................................. | 307/475 X |
| 4,906,871 | 3/1990 | Iida .................................. | 307/475 X |

*Primary Examiner*—David Hudspeth
*Attorney, Agent, or Firm*—Helfgott & Karas

[57] ABSTRACT

An emitter coupled logic circuit comprises a first NPN transistor having a base connected to an input terminal, a second NPN transistor having an emitter connected commonly to an emitter of the first NPN transitor, a base connected to receive a first reference voltage and a collector connected to a high voltage line, and a constant current source connected between a low voltage line and the commonly connected emitters of the first and second NPN transistors. A third NPN transistor having an emitter connected to a collector of the first NPN transistor and a base connected to receive a second reference voltage. A collector of the third NPN transistor is connected through a resister to the high voltage line. A PNP transistor has a base connected to the collector of the first NPN transistor and a collector connected to the low voltage line, and a fourth NPN transistor has a base connected to the collector of the third NPN transistor and a collector connected to the high voltage line. Emitters of the PNP transistor and the fourth NPN transistor is connected to each other and also connected to an output terminal of the emitter coupled logic circuit. When the second NPN transistor is turned on and the first NPN transistor is turned off, the fourth NPN transistor is turned on and the third NPN transistor and the PNP transistor are off, with the result that a load capacitance between the high voltage line and the output terminal is discharged through the turned-on fourth NPN transistor.

10 Claims, 4 Drawing Sheets

EMITTER COUPLED LOGIC CIRCUIT HAVING RAPID OUTPUT VOLTAGE

BACKGROUND OF THE INVENTION

1. Field of the Invention

The present invention relates to an emitter coupled logic circuit, and more specifically to such a circuit having a rapid output voltage falling-down property.

2. Description of Related Art

At present, emitter coupled logic circuits have been used in various kinds of electronic circuits. Referring to FIG. 1, there is shown a circuit diagram of a conventional typical emitter coupled logic circuit. The shown circuit includes a first NPN transistor Q10 having a base connected to an input terminal 10 and a collector connected through a resister R to a high voltage line so as to receive a collector supply voltage $V_{CC}$. An emitter of the first NPN transistor Q10 is commonly connected to an emitter of another or second NPN transistor Q20, which in turn have a base connected to a reference voltage Vref and a collector connected directly to the high voltage line of the collector supply voltage $V_{CC}$. The commonly connected emitters of the first and second NPN transistors Q10 and Q20 are connected through a constant current source $I_{20}$ to a low voltage line for an emitter supply voltage $V_{EE}$. A connection nobe between the resister R and the collector of the first NPN transistor Q10 is connected to a base of a third NPN transistor Q30, whose collector is in turn connected directly to the high voltage line of the collector supply voltage $V_{CC}$. An emitter of the third NPN transistor Q30 is connected to an output terminal 12 and also connected through another constant current source $I_{30}$ to the low voltage line of the emitter supply voltage $V_{EE}$. In addition, a load capacitance $C_L$ formed due to a wiring capacitance and others exists between the output terminal 12 and the high voltage line of the collector supply voltage $V_{CC}$.

In the above mentioned emitter coupled logic circuit, the reference voltage Vref is set at an intermediate voltage between a high level voltage and a low level voltage of an input signal $V_{IN}$ applied to the input terminal 10. Therefore, if the input signal $V_{IN}$ is at the high level, the transistor Q10 is turned on, and the transistor Q20 is turned off. Accordingly, a collector current will flow through the transistor Q10, so that a corresponding voltage drop will occur across the resister R. Namely, a potential on the collector of the transistor Q10 will drop. As a result, since the transistor Q30 forms an emitter follower, an output signal voltage $V_{OUT}$ appearing on the output terminal 12 is brought to a low voltage expressed as follows:

$$V_{OUT} = V_{CC} - (R \cdot I_{20} + V_{BEQ30})$$

where $V_{BEQ30}$ is a base-emitter voltage of the transistor Q30.

On the other hand, if the input signal $V_{IN}$ is at the low level, the transistor Q10 is turned off, and the transistor Q20 is turned on. Therefore, the collector current will not flow through the transistor Q10, so that the potential on the collector of the transistor Q10 will be almost $V_{CC}$ and the transistor Q30 is turned on. As a result, the voltage $V_{OUT}$ is brought to a high voltage expressed as follows:

$$V_{OUT} = V_{CC} - V_{BEQ30}$$

Therefore, the shown circuit operates as an inverter having an output logic amplitude of $R \cdot I_{20}$.

In the above mentioned emitter coupled logic circuit, when the potential $V_{OUT}$ of the output terminal 12 is caused to change from the low level to the high level, an electric charge stored in the capacitance $C_L$ is discharged by an emitter current of the transistor Q30, with the result that the output potential $V_{OUT}$ is brought to the high level. On the other hand, when the potential $V_{OUT}$ of the output terminal 12 is caused to change from the high level to the low level, the capacitance $C_L$ is charged by the constant current source $I_{30}$, with the result that the output potential $V_{OUT}$ is brought to the low level. In this connection, it has been an ordinary practice that a current capacity of the constant current source $I_{30}$ is much smaller than the emitter current of the transistor Q30. Accordingly, the falling-down time of the output potential $V_{OUT}$ is considerably larger than the rising-up time of the output potential $V_{OUT}$.

SUMMARY OF THE INVENTION

Accordingly, it is an object of the present invention to provide an emitter coupled logic circuit which has overcome the above mentioned defect of the conventional one.

Another object of the present invention is to provide an emitter coupled logic circuit having a rapid output voltage falling-down speed.

A further object of the present invention is to provide an emitter coupled logic circuit having an output voltage falling-down speed comparable to an output voltage rising-up speed.

The above and other objects of the present invention are achieved in accordance with the present invention by an emitter coupled logic circuit comprising a first NPN transistor having a base connected to an input terminal, a second NPN transistor having an emitter connected commonly to an emitter of the first NPN transistor and a base connected to receive a first reference voltage, a constant current source connected between a low voltage line and the commonly connected emitters of the first and second NPN transistors, one of the first and second NPN transistors having a collector connected to a high voltage line, a third NPN transistor having an emitter connected to a collector of the other of the first and second NPN transistors and a base connected to receive a second reference voltage, a collector of the third NPN transistor being connected through a resister to the high voltage line, a PNP transistor having a base connected to the collector of the other of the first and second NPN transistors and a collector connected to the low voltage line, and a fourth NPN transistor having a base connected to the collector of the third NPN transistor and a collector connected to the high voltage line, emitters of the PNP transistor and the fourth NPN transistor being connected to each other and also connected to an output terminal of the emitter coupled logic circuit, whereby when the one of the first and second NPN transistors is turned on and the other of the first and second NPN transistors is turned off, the fourth NPN transistor is turned on and the third NPN transistor and the PNP transistor are off, with the result that a load capacitance between the high voltage line and the output terminal is discharged through the turned-on fourth NPN transistor, and when the one of the first and second NPN transistors is turned off and the other of the first and second NPN transistors is turned on, the third NPN transistor and the PNP transistor are on and the fourth NPN transistor is turned off, with the result that the load capacitance between the high voltage line and the output terminal is charged through the turned-on PNP transistor.

With the above mentioned circuit arrangement, a load capacitance existing between the output terminal and the high voltage line is charged by the PNP transistor, differently from the prior art in which the load capacitance is charged by the constant current source. Therefore, by causing the PNP transistor equal to have a sufficient current capacity, the load capacitance can be charged at a high speed. In other words, the falling down time from the high level to the low level is shortened.

According to another aspect of the present invention, there is provided an emitter coupled logic circuit comprising:

an input terminal and an output terminal;

a differential circuit including a first transistor having a control electrode connected to the input terminal and a main current path which is selectively rendered conductive or non-conductive in accordance with a potential applied to the control electrode, and a second transistor having a control electrode connected to receive a first reference voltage and a main current path which is selectively rendered conductive or non-conductive in accordance with a potential applied to the control electrode of the second transistor, and a constant current source having one end connected to a low voltage line and the other end connected commonly to one end of the main current path of each of the first and second transistors, the other end of the main current path of one of the first and second transistors being connected to a high voltage line, and the other end of the main current path of the other of the first and second transistors being connected through a resistive load to the high voltage line, so that either of the first and second transistors is turned on and the other is turned off in accordance with a magnitude of a signal applied through the input terminal to the control electrode of the first transistor; and a complementary output circuit including a first switching element having one end connected to the high voltage line and the other end connected to the output terminal, the first switching element having a control input connected to a connection node between the resistive load and the other end of the main current path of the other of the first and second transistors, and the first switching element being rendered conductive when a high voltage appears on the connection node, and a second switching element having one end connected to the low voltage line and the other end connected to the output terminal, the second switching element having a control input connected to the connection node, and being rendered conductive when a low voltage appears on the connection node, whereby when the one of the first and second transistors in the differential circuit is turned on and the other of the first and second transistors is turned off, when the first switching element of the complementary output circuit is on and the second switching element is off, with the result that a load capacitance between the high voltage line and the output terminal is discharged through the first switching element, and when the one of the first and second transistors is turned off and the other of the first and second transistors is turned on, the first switching element is off and the second switching element is on, with the result that the load capacitance between the high voltage line and the output terminal is charged through the second switching element.

With the above mentioned circuit arrangement, a load capacitance existing between the output terminal and the high voltage line is alternatively discharged and charged by the first and second switching elements of the complementary output circuit, respectively. Therefore, by making an current capacity of the first and second switching elements large and equal to each other, the load capacitance can be charged and discharged at the same high speed. In other words, the falling-down time is shortened and made equal to the rising-up time.

According to a further aspect of the present invention, there is provided an inverting logic circuit comprising a first NPN transistor having a base connected to an input terminal and an emitter connected to a low voltage line so that the first NPN transistor is selectively turned on or off in accordance with an potential of a signal applied to the input terminal, a second NPN transistor having an emitter connected to a collector of the first NPN transistor and a base connected to receive a reference voltage, a collector of the second NPN transistor being connected through a resister to a high voltageline, a PNP transistor having a base connected to the collector of the first NPN transistor and a collector connected to the low voltage line, and a third NPN transistor having a base connected to the collector of the second NPN transistor and a collector connected to the high voltage line, emitters of the PNP tranistor and the third NPN transistor being connected to each other and also connected to an output terminal of the inverting logic circuit, whereby when the first NPN transistor is turned off, the third NPN transistor is turned on and the second NPN transistor and the PNP transistor are off, with the result that a load capacitance between the high voltage line and the output terminal is discharged through the turned-on third NPN transistor, and when the first NPN transistor is turned on, the second NPN transistor and the PNP transistor are on and the third NPN transistor is turned off, with the result that the load capacitance between the high voltage line and the output terminal is charged through the turned-on PNP transistor.

The above and other objects, features and advantages of the present invention will be apparent from the following description of preferred embodiments of the invention with reference to the accompanying drawings.

DESCRIPTION OF THE PREFERRED EMBODIMENTS

Figure 1:
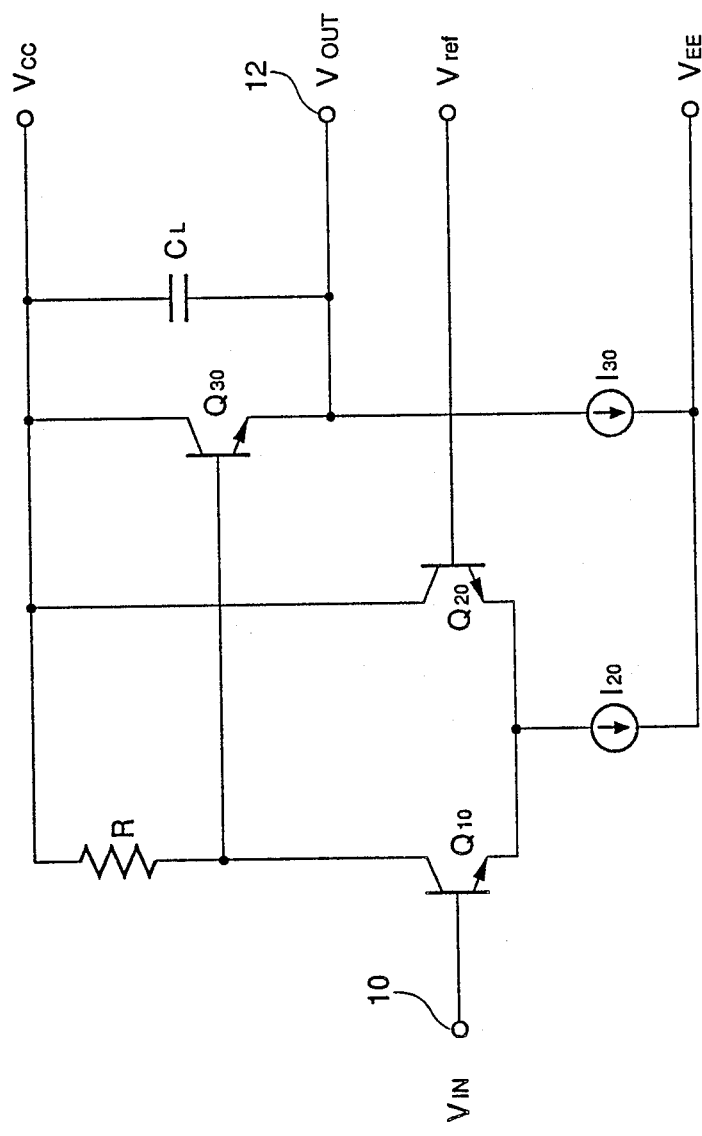
FIG. 1 is a circuit diagram of an example of a conventional emitter coupled logic circuit.
Figure 2:
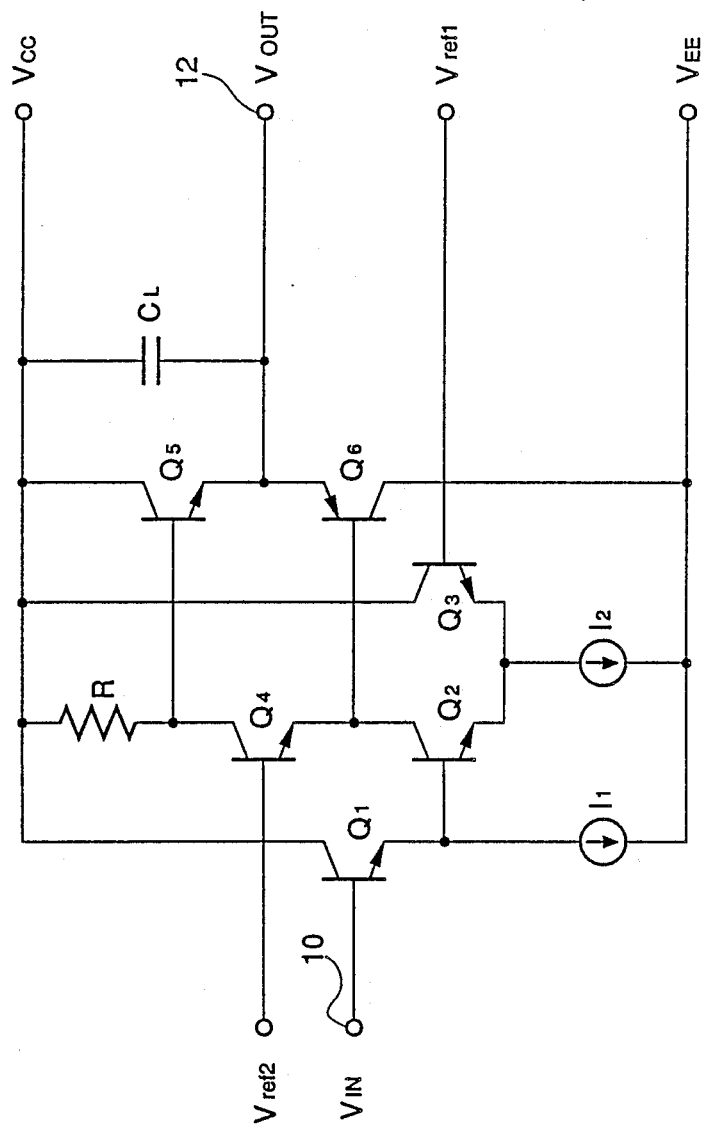
FIG. 2 is a circuit diagram of a first embodiment of the emitter coupled logic circuit in accordance with the present invention.

Referring to FIG. 2, there is shown a circuit diagram of a first embodiment of the emitter coupled logic circuit in accordance with the present invention.

The shown circuit includes an NPN transistor Q1 having a base connected to an input terminal 10 and a collector connected to a high voltage line so as to receive a collector supply voltage $V_{CC}$. An emitter of the NPN transistor Q1 is connected through a constant current source $I_1$ to a low voltage line for an emitter supply voltage $V_{EE}$, and also connected to a base of another NPN transistor Q2.

An emitter of the NPN transistor Q2 is commonly connected to an emitter of an NPN transistor Q3, which in turn has a base connected to a first reference voltage Vref1 and a collector connected directly to the high voltage line of the collector supply voltage $V_{CC}$. The commonly connected emitters of the NPN transistors Q2 and Q3 are connected through a constant current source $I_2$ to the low voltage line for the emitter supply voltage $V_{EE}$.

In addition, a collector of the NPN transistor Q2 is connected to an emitter of an NPN transistor Q4, which has a base connected to a second reference voltage Vref2. A collector of the NPN transistor Q4 is connected through a resister R to the high voltage line for the collector supply voltage $V_{CC}$.

A connection node between the resister R and the collector of the NPN transistor Q4 is connected to a base of an NPN transistor Q5, whose collector is in turn connected directly to the high voltage line of the collector supply voltage $V_{CC}$. Furthermore, a connection node between the emitter of the NPN transistor Q4 and the collector of the NPN transistor Q2 is connected to a base of a PNP transistor Q6, which in turn has a collector connected directly to the low voltage line of the emitter supply voltage $V_{EE}$. An emitter of the PNP transistor Q6 and an emitter of the NPN transistor Q5 are connected to each other and also to an output terminal 12.

In addition, a load capacitance $C_L$ formed due to a wiring capacitance and others exists between the output terminal 12 and the high voltage line of the collector supply voltage $V_{CC}$, namely between the emitter and the collector of the NPN transistor Q5.

In the above mentioned emitter coupled logic circuit, the transistor Q1 and the constant current source I1 form an emitter follower which acts as a level shift circuit for matching an input level to an output level. The transistors Q2 and Q3 cooperates to form an voltage comparison differential circuit, and the transistors Q5 and Q6 form together a complementary output circuit as will be apparent from the following description. A voltage drop across the resister R caused by a collector current of the transistor Q2 is detected and outputted by the complementary output circuit formed of the transistors Q5 and Q6.

Here, the reference voltage Vref1 is set at a voltage which is lower, by a base-emitter voltage $V_{BE}$ of the transistor Q1, than an intermediate voltage between a high level voltage and a low level voltage of an input signal $V_{IN}$ applied to the input terminal 10. The reference voltage Vref2 is set at the low level voltage.

If the input signal $V_{IN}$ of the low level is applied to the input terminal 10, the transistor Q2 is turned off, and the transistor Q3 is turned on. Therefore, a collector current will not flow through the transistor Q2, so that the transistors Q4 and Q6 are rendered off. As a result, a base potential of the transistor Q5 is elevated near to the collector supply voltage $V_{CC}$, so that transistor Q5 is turned on and an electric charge stored in the capacitance $C_L$ is discharged through the transistor Q5. Thus, the output voltage $V_{OUT}$ is brought to a high voltage level.

If the input signal $V_{IN}$ is brought to the high level, the transistor Q2 is turned on, and the transistor Q3 is turned off. Therefore, a collector current flow through the transistor Q2, so that the transistors Q4 and Q6 are rendered on. Accordingly, a corresponding voltage drop $R \cdot I_2$ will occur across the resister R. Namely, the base potential of the transistor Q5 will drop, so that the transistor Q5 is turned off. On the other hand, since the transistor Q6 is on, the capacitance $C_L$ is charged by a large current which is supplied through the turned-on transistor Q6. As a result, the voltage $V_{OUT}$ appearing on the output terminal 12 is brought to the low voltage at a high speed.

As seen from the above description, the circuit shown in FIG. 2 operates as an inverter. Therefore, if one or more NPN transistors are connected in parallel to the transistor Q1, a multi-input NOR circuit can be easily realized.

Figure 3:
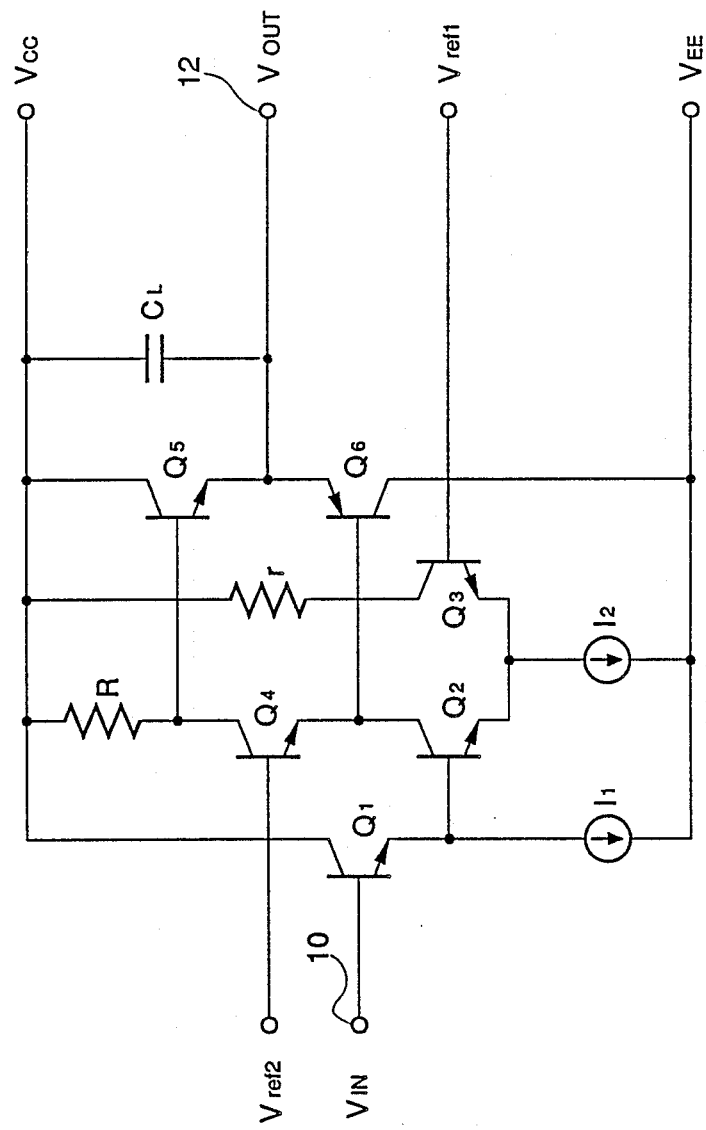
FIG. 3 is a circuit diagram of a modification of the emitter coupled logic circuit shown in FIG. 2.

In the above mentioned embodiment, the collector of the transistor Q3 is connected directly to the high voltage line of the collector supply voltage $V_{CC}$. However, the collector of the transistor Q3 can be connected through a resister r to a high voltage line of the collector supply voltage $V_{CC}$, as shown in FIG. 3.

Figure 4:
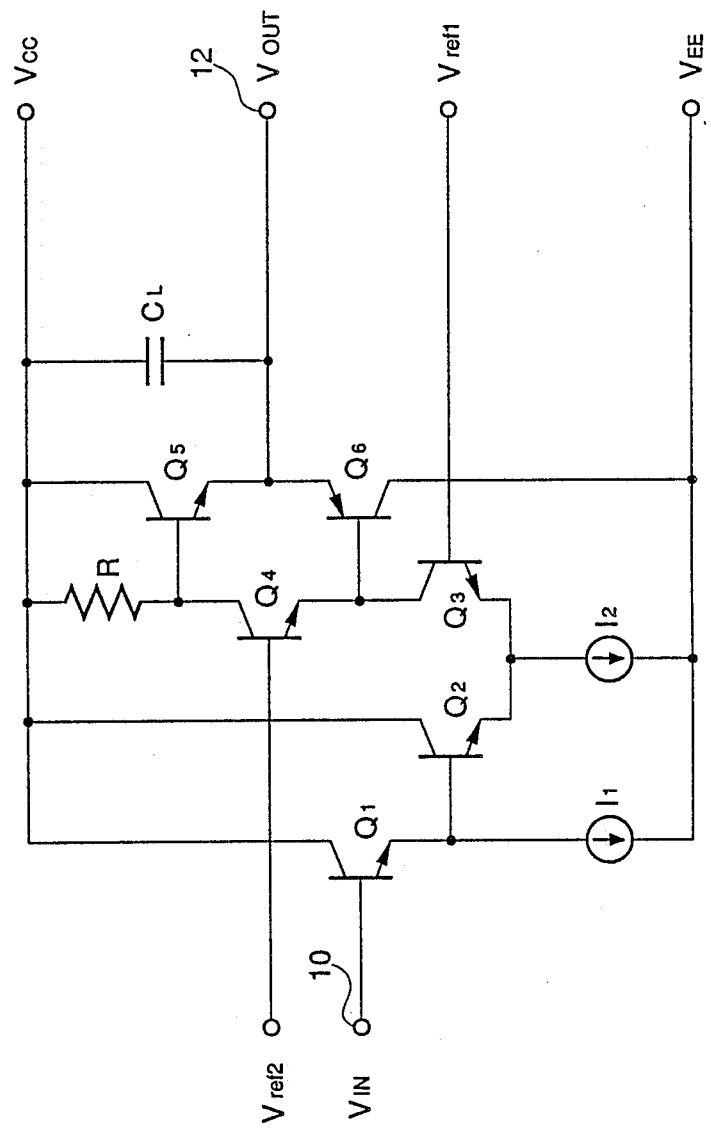
FIG. 4 is a circuit diagram of a second embodiment of the emitter coupled logic circuit in accordance with the present invention.

Turning to FIG. 4, there is shown a circuit diagram of a second embodiment of the emitter coupled logic circuit in accordance with the present invention. In FIG. 4, circuit elements similar or corresponding to those shown in FIG. 2 are given the same Reference Numerals or Signs, and explanation thereof will be omitted.

As seen from comparison between FIGS. 2 and 4, the embodiment shown in FIG. 4 has the complementary output circuit (composed of the NPN transistor Q5 and the PNP transistor Q6) connected to the transistor Q3, not the transistor Q2. In addition, it will be apparent to persons skilled in the art that the embodiment shown in FIG. 4 will operate similarly to the circuit shown in FIG. 2, except that a relation between an input and an output is the reverse of that in the circuit shown in FIG. 2. In other words, the embodiment shown in FIG. 4 operates a non-inverting circuit or a buffer circuit. Therefore, it will be easily understood that if one or more NPN transistors are connected in parallel to the transistors Q1, a multi-input OR circuit can be realized.

As seen from the above description, the output stage of the emitter coupled logic circuit is in the form of a complementary circuit, so that the falling-down time of the output voltage from the high level to the low level is shortened. Therefore, a high speed logic circuit can be obtained.

The invention has thus been shown and described with reference to the specific embodiments. However, it should be noted that the present invention is in no way limited to the details of the illustrated structures but changes and modifications may be made within the scope of the appended claims.

I claim:

1. An emitter coupled logic circuit comprising a first NPN transistor having a base connected to an input terminal, a second NPN transistor having an emitter connected commonly to an emitter of said first NPN transistor and a base connected to receive a first reference voltage, a constant current source connected between a low voltage line and the commonly connected emitters of said first and second NPN transistors, one of said first and second NPN transistors having a collector connected to a high voltage line, a third NPN transistor having an emitter connected to a collector of the other of said first and second NPN transistors and a base connected to receive a second reference voltage, a collector of said third NPN transistor being connected through a resister to said high voltage line, a PNP transistor having a base connected to said collector of the other of said first and second NPN transistors and a collector connected to said low voltage line, and a fourth NPN transistor having a base connected to said collector of said third NPN transistor and a collector connected to said high voltage line, emitters of said PNP transistor and said fourth NPN transistor being connected to each other and also connected to an output terminal of the emitter coupled logic circuit, whereby when said one of said first and second NPN transistors is turned on and the other of said first and second NPN transistors is turned off, said fourth NPN transistor is turned on and said thrid NPN transistor and said PNP transistor are off, with the result that a load capacitance between said high voltage line and said output terminal is discharged through said turned-on fourth NPN transistor, and when said one of said first and second NPN transistors is turned off and the other of said first and second NPN transistors is turned on, said third NPN transistor and said PNP transistor are on and said fourth NPN transistor is turned off, with the result that said load capacitance between said high voltage line and said output terminal is charged through said turned-on PNP transistor.

2. A circuit claimed in claim 1 wherein said collector of said one of said first and second NPN transistors is connected directly to said high voltage line.

3. A circuit claimed in claim 1 wherein said collector of said one of said first and second NPN transistors is connected through a resister to said high voltage line.

4. A circuit claimed in claim 1 further including a level shift circuit having an input connected to said input terminal and an output connected to said base of said first NPN transistor.

5. A circuit claimed in claim 4 wherein said level shift circuit includes a fifth NPN transistor having a base connected to said input terminal and a collector connected to said high voltage line, an emitter of said fifth NPN transistor being connected to said base of said first NPN transistor and also connected through a second current source to said low voltage line.

6. An emitter coupled logic circuit comprising:
an input terminal and an output terminal; a differential circuit including a first transistor having a control electrode connected to said input terminal and a main current path which is selectively rendered conductive or non-conductive in accordance with a potential applied to said control electrode, and a second transistor having a control electrode connected to receive a first reference voltage and a main current path which is selectively rendered conductive or non-conductive in accordance with a potential applied to said control electrode of said second transistor, and a constant current source having one end connected to a low voltage line and the other end connected commonly to one end of the main current path of each of said first and second transistors, the other end of the main current path of one of said first and second transistors being connected to a high voltage line, and the other end of the main current path of the other of said first and second transistors being connected through a resistive load to said high voltage line, so that either of said first and second transistors is turned on and the other is turned off in accordance with a magnitude of a signal applied through said input terminal to said control electrode of said first transistor; and a complementary output circuit including a first switching element having one end connected to said high voltage line and the other end connected to said output terminal, said first switching element having a control input connected to a connection node between said resistive load and the other end of the main current path of the other of said first and second transistors, and said first switching element being rendered conductive when a high voltage appears on said connection node, and a second switching element having one end connected to said low voltage line and the other end connected to said output terminal, said second switching element having a control input connected to said connection node, and being rendered conductive when a low voltage appears on said connection node, whereby when said one of said first and second transistors in said differential circuit is turned on and the other of said first and second transistors is turned off, said first switching element of said complementary output circuit is on and said second switching element is off, with the result that a load capacitance between said high voltage line and said output terminal is discharged through said first switching element, and when said one of said first and second transistors is turned off and the other of said first and second transistors is turned on, said first switching element is off and said second switching element is on, with the result that said load capacitance between said high voltage line and said output terminal is charged through said second switching element.

7. A circuit claimed in claim 6 further including an on-off circuit connected between said resistive load and the other end of the main current path of the other of said first and second transistors, said on-off circuit operating to become conductive when the other of said first and second transistors is turned on and non-conductive when the other of said first and second transistors is turned off; and wherein said control input of said first switching element of said complementary output circuit is connected to a first connection node between said resistive load and said on-off circuit so that said first switching element is rendered conductive when a high voltage appears on said first connection node, and said control input of said second switching element of said complementary output circuit is connected to a second connection node between said on-off circuit and the other end of the main current path of the other of said first and second transistors so that said second switching element is rendered conductive when a low voltage appears on said second connection node.

8. A circuit claimed in claim 6 further including a level shift circuit having an input connected to said input terminal and an output connected to said control electrode of said first transistor of said differential circuit.

9. A circuit claimed in claim 8 wherein said level shift circuit includes an NPN transistor having a base connected to said input terminal and a collector connected to said high voltage line, an emitter of said NPN transistor being connected to said control electrode of said first transistor of said differential circuit and also connected through a second current source to said low voltage line.

10. An inverting logic circuit comprising a first NPN transistor having a base connected to an input terminal and an emitter connected to a low voltage line so that said first NPN transistor is selectively turned on or off in accordance with an potential of a signal applied to said input terminal, a second NPN transistor having an emitter connected to a collector of said first NPN transistor and a base connected to receive a reference voltage, a collector of said second NPN transistor being connected through a resister to a high voltage line, a PNP transistor having a base connected to said collector of said first NPN transistor and a collector connected to said low voltage line, and a third NPN transistor having a base connected to said collector of said second NPN transistor and a collector connected to said high voltage line, emitters of said PNP transistor and said third NPN transistor being connected to each other and also connected to an output terminal of the inverting logic circuit, whereby when said first NPN transistor is turned off, said third NPN transistor is turned on and said second NPN transistor and said PNP transistor are off, with the result that a load capacitance between said high voltage line and said output terminal is discharged through said turned-on third NPN transistor, and when said first NPN transistor is turned on, said second NPN transistor and said PNP transistor are on and said third NPN transistor is turned off, with the result that said load capacitance between said high voltage line and said output terminal is charged through said turned-on PNP transistor.

* * * * *